United States Patent
Yu

[11] Patent Number: 6,028,367
[45] Date of Patent: Feb. 22, 2000

[54] BONDS PADS EQUIPPED WITH HEAT DISSIPATING RINGS AND METHOD FOR FORMING

[75] Inventor: Chen Hua Yu, Hsin-Chu, Taiwan

[73] Assignee: Taiwan Semiconductor Manufacturing Company, Ltd., Hsin-Chu, Taiwan

[21] Appl. No.: 09/306,950

[22] Filed: May 7, 1999

[51] Int. Cl.[7] ........................ H01L 23/48; H01L 23/52; H01L 29/40

[52] U.S. Cl. ........................ 257/780; 257/781; 257/706; 257/773; 257/786

[58] Field of Search .................................. 257/780, 781, 257/786, 706, 707, 773, 774

[56] References Cited

U.S. PATENT DOCUMENTS

| | | |
|---|---|---|
| 5,248,903 | 9/1993 | Heim . |
| 5,404,047 | 4/1995 | Rostoker et al. . |
| 5,736,791 | 4/1998 | Fujiki et al. . |
| 5,739,587 | 4/1998 | Sato . |
| 5,923,088 | 7/1999 | Shiue et al. . |
| 5,959,356 | 9/1999 | Oh . |

*Primary Examiner*—Sheila V. Clark
*Attorney, Agent, or Firm*—Tung & Associates

[57] ABSTRACT

A bond pad structure that is equipped with a heat dissipating ring surrounding the pad and a method for forming the structure are disclosed. The bond pad structure includes a bond pad that is substantially surrounded and insulated by a layer of inter-metal-dielectric (IMD) material and is formed of two metal layers and a plurality of metal via plugs connected thereinbetween, and a heat dissipating ring surrounding and spaced-apart from the bond pad formed of an upper conductive ring and a lower conductive ring of substantially the same configuration connected thereinbetween by a plurality of dummy via plugs formed of a thermally conductive material. A method for forming the bond pad structure that is equipped with the heat dissipating ring is further disclosed in which three separate IMD layers are provided for forming photolithographically the bond pad structure and the heat dissipating ring simultaneously.

12 Claims, 1 Drawing Sheet

BONDS PADS EQUIPPED WITH HEAT DISSIPATING RINGS AND METHOD FOR FORMING

FIELD OF THE INVENTION

The present invention generally relates to bond pads on a semiconductor structure and a method for forming the bond pads and more particularly, relates to bond pads on a semiconductor structure that are built with surrounding and spaced-apart heat dissipating rings for improving heat conductance and mechanical strength of the pads and method for forming such pads.

BACKGROUND OF THE INVENTION

In the fabrication processes for semiconductor devices, an integrated circuit chip is frequently assembled in a package in a final process step to complete the fabrication process. The assembled package can then be connected to a printed circuit board as part as a large circuit. To establish an electrical communication with the integrated circuit chip, a wire bonding process is frequently used to connect a multiplicity of bond pads on the integrated circuit chip to the outside circuitry.

In a typical IC chip, active circuit elements such as transistors, resistors, etc., are positioned in the central portion, i.e., the active region, of the chip while the bond pads are normally arranged around the periphery of the active region such that active circuit elements are not likely to be damaged during a subsequent bonding process. When a wire bonding process is performed on a bond pad on an IC chip, the process normally entails the bonding of a gold or aluminum wire to the bond pad by fusing the two together with ultrasonic energy. The wire is then pulled away from the bond pad after the bond is formed. During the bonding of the gold wire to the pad and the pulling away of the wire from the pad, high mechanical stress is placed on the bond pad. When the bond pads are not properly formed, defects such as delamination have been encountered. This occurs due to the fact that during the attachment of a gold wire to a bond pad, a high level of mechanical stress is placed on the pad. It occurs when a relatively large, heavy bond is placed on top of layers which may not have strong adhesion to the underlying layers. For instance, one factor that may affect adhesion between the layers is the common usage of a diffusion barrier layer formed of a material such as TiN for preventing aluminum diffusion into underlying conductive layers during subsequent high temperature processes. The diffusion barrier layer utilized, i.e., TiN, TiW or other alloys, does not have strong adhesion to the underlying oxide layer in the bond pad. This is only one example that bond pad lift-off defect occurs. A lift-off problem frequently occurs at an interface between a polycide layer and a field oxide layer.

Other reasons may also cause bond pad lift-off or delamination problems in semiconductor devices. For instance, in more recently developed semiconductor devices wherein low dielectric constant (low-k) materials have been used which further cause adhesion problems between these low-k dielectric materials and the underlying oxide layers. The adhesion of low-k dielectric material, or inter-metal-dielectric (IMD) material to oxide is poorer than that of oxide to oxide. The use of low-k dielectric materials, such as HSQ (hydrogen silsesquioxane) and MSQ (methylsil sesquioxane) have been desirable in high performance semiconductor structures since due to their low-k characteristics, thinner layers of the materials may be utilized as insulating layers. Another drawback of these low-k dielectric materials is their low thermal conductivity when compared to that of regular oxide. During a chip bonding process, the local temperature around a bond pad is significantly higher due to the poor thermal conductivity of the low-k dielectric material. The thermal stress caused by the poor thermal conductivity of IMD, in addition to the mechanical stresses caused by the bonding operation, may cause delamination of the low-k IMD layers from their underlying oxide layers.

Others have attempted to solve the problems caused by the low-k IMD materials due to their poor thermal conductivity and poor adhesion to oxide. For instance, a plurality of via plugs have been used between metal bonding pads in order to improve heat conduction and film integrity. The use of multiple via plugs alleviates the thermal stress problem somewhat when compared to a single via plug since better heat conductance is achieved. The mechanical strength is also somewhat improved due to the anchoring capability of multiple via plugs which is better than that of a single via plug. However, the use of a plurality of via plugs between metal bonding pads alone is insufficient to prevent the delamination or thermal stress problems when low-k IMD materials are utilized in semiconductor structures.

It is therefore an object of the present invention to provide bond pads in a semiconductor structure that do not have the drawbacks or shortcomings of bond pads prepared by conventional methods.

It is another object of the present invention to provide bond pads in a semiconductor structure that have significantly improved thermal conductance and mechanical strength.

It is a further object of the present invention to provide bond pads in a semiconductor structure that are equipped with surrounding and spaced-apart heat dissipating rings.

It is another further object of the present invention to provide bond pads in a semiconductor structure that are equipped with heat dissipating rings which are fabricated during the same fabrication process for forming the bond pads.

It is still another object of the present invention to provide bond pads in a semiconductor structure that are equipped with heat dissipating rings which provide improved thermal conductance and mechanical anchoring capability.

It is yet another object of the present invention to provide bond pads equipped with heat dissipating rings which are formed of an upper conductive ring and a lower conductive ring of substantially the same shape connected thereinbetween by a plurality of dummy via plugs formed by a thermally conductive material.

It is still another further object of the present invention to provide a method for forming a heat dissipating ring around a bond pad for improving heat conductance and mechanical strength of the pad by photolithographically forming the heat dissipating ring simultaneously with the bond pad.

It is yet another further object of the present invention to provide a semiconductor structure that includes a bond pad that is substantially surrounded and insulated by a low-k IMD material layer and a heat dissipating ring surrounding the bond pad for improving thermal conductance and mechanical strength of the pad.

SUMMARY OF THE INVENTION

In accordance with the present invention, bond pads equipped with heat dissipating rings and a method for forming the bond pads are provided.

In a preferred embodiment, a semiconductor structure is provided which includes a pre-processed semiconducting substrate that has a dielectric material layer on top, a bond pad substantially surrounded and insulated by the dielectric material layer, the bond pad is formed of two metal layers and a plurality of metal via plugs connected thereinbetween, and a heat dissipating ring surrounding and spaced-apart from the bond pad, the heat dissipating ring is formed of an upper conductive ring and a lower conductive ring of substantially the same configuration connected thereinbetween by a plurality of dummy via plugs formed of a thermally conductive material.

The semiconductor structure may further include a dielectric material layer on top of the structure that is formed of a low dielectric constant (low-k) material. The low-k material may be hydrogen silsesquioxane (HSQ) or methyl silsesquioxane (MSQ). The structure may further include a second heat dissipating ring positioned outside and spaced-apart from the heat dissipating ring. The thermally conductive material for forming the dummy via plugs may be a metallic material, for instance, a refractory metal, aluminum or copper. The plurality of dummy via plugs and the upper and lower conductive rings do not intercept any metal runners for the circuit formed in the semiconductor structure.

The present invention is further directed to a method for forming a heat dissipating ring around a bond pad for improving heat conductance and mechanical strength which can be carried out by the operating steps of providing a pre-processed semiconducting substrate that has a first layer of inter-metal-dielectric (IMD) material on top, forming photolithographically a first metal pad and a first metal ring surrounding and spaced-apart from the first metal pad, depositing a second IMD layer on top of the first metal ring, forming photolithographically in the second IMD layer a first plurality of metal via plugs on the first metal pad and a second plurality of dummy via plugs on the first metal ring, depositing a third IMD layer on top of the first plurality of metal via plugs and the second plurality of dummy via plugs, and forming photolithographically in the third IMD layer a second metal pad connected to the first plurality of metal via plugs and a second metal ring connected to the second plurality of dummy via plugs, whereby the first metal pad, the second metal pad and the first plurality of metal via plugs connected thereinbetween form the bond pad surrounded by a spaced-apart heat dissipating ring formed by the first metal ring, the second metal ring and the second plurality of dummy via plugs connected thereinbetween.

The method for forming a heat dissipating ring around a bond pad may further include the step of depositing the first, the second and the third IMD layer with a high dielectric constant material. The method may further include the step of depositing the first, second, and third IMD layer with HSQ or MSQ. The method may further include the step of forming the first metal pad and the first metal ring by the same metal, the step of forming the first plurality of metal via plugs and the second plurality of dummy via plugs of the same metal, or the step of forming the first plurality of metal via plugs and the second plurality of dummy via plugs in a refractory metal, aluminum or copper. The method may further include the step of forming the second metal pad and the second metal ring in the same metal deposition process. In the method, the first metal ring, the second plurality of dummy via plugs and the second metal ring do not intercept metal runners for the bond pad.

The present invention is further directed to a bond pad equipped with a heat dissipating ring that includes a bond pad substantially surrounded and insulated by a layer of IMD material, the bond pad may be formed of two metal layers and a plurality of metal via plugs connected thereinbetween, and a heat dissipating ring surrounding and spaced-apart from the bond pad, the heat dissipating ring may be formed of an upper conductive ring and a lower conductive ring of substantially the same configuration connected thereinbetween by a plurality of dummy via plugs formed of a thermally conductive material.

In the bond pad equipped with a heat dissipating ring, the layer of IMD material may be a low dielectric constant material, or may be a HSQ or MSQ material. The heat dissipating ring anchors at least two dielectric material layers together achieving improved mechanical strength. The plurality of metal via plugs and the plurality of dummy via plugs may be formed of the same metal selected from the group consisting of refractory metals, aluminum and copper.

BRIEF DESCRIPTION OF THE DRAWINGS

These and other objects, features and advantages of the present invent on will become apparent from the following detailed description and the appended drawings in which.

DETAILED DESCRIPTION OF THE PREFERRED EMBODIMENT

Figure 1:
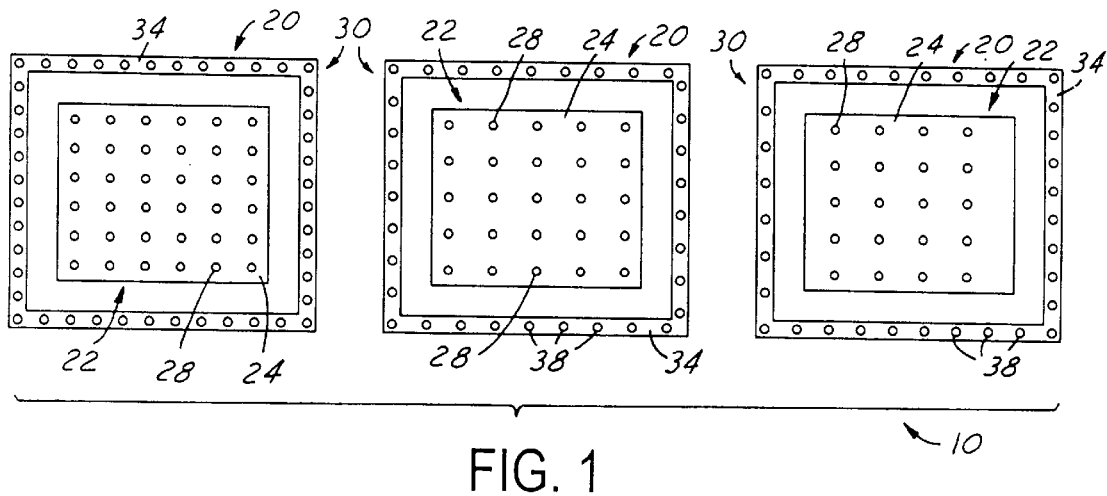
FIG. 1 is an enlarged, plane view of the present invention bond pads each surrounded by a heat dissipating ring.

The present invention discloses bond pads that are equipped with heat dissipating rings and a method for fabricating such bond pads in a semiconductor structure.

According to the present invention, a bond pad that is equipped with a heat dissipating ring may include a bond pad that is substantially surrounded and insulated by a layer of IMD material wherein the bond pad may be formed of two metal layers (or two pads) and a plurality of metal via plugs connected thereinbetween, and a heat dissipating ring that surrounds and is spaced-apart from the bond pad wherein the ring may be formed of an upper thermally conductive ring and a lower thermally conductive ring of substantially the same configuration connected thereinbetween by a plurality of dummy via plugs formed of a thermally conductive material. The thermally conductive material utilized in forming the upper ring, the lower ring and the dummy plugs may be suitably an electrically conductive material such as metal. They can be formed in the same photolithographic process for forming the bond pads such that no additional processing steps are required for forming the heat dissipating ring. In so doing, the same metallic material in forming the bond pads and the plurality of metal via plugs, i.e., a refractory metal, aluminum or copper, may be suitably used in forming the heat dissipating rings, i.e., the upper ring, the lower ring and the dummy plugs.

The present invention novel structure is especially suitable in semiconductor structure that utilizes low-k dielectric materials for improved performance and for utilizing a thinner layer of such materials For instance, a suitable low-k IMD material may be a HSQ (hydrogen silsesquioxane) or MSQ (methyl silsesquioxane) material. The present invention novel heat dissipating ring not only provides improved heat conductance in the low-k IMD materials, but also improves mechanical strength by anchoring together the dielectric material layers by the dummy plugs in-situ formed with the via plugs. For a simplified process, the same material used for forming the via plugs are utilized for forming the dummy plugs.

The present invention novel method can further be used to provide a semiconductor structure that includes a pre-processed semiconducting substrate with a low-k IMD material layer on top, and a bond pad equipped with a heat dissipating ring surrounding the pad formed in the low-k IMD layer. The heat dissipating can be formed by the same photolithographic process and by the same metal deposition process such that no additional fabrication steps are required for making the present invention heat dissipating ring. The present invention heat dissipating ring can be formed in three separate steps, i.e., the lower conductive ring, the plurality of dummy plugs and the upper conductive ring which are connected together.

The present invention further discloses a method for forming a heat dissipating ring around a bond pad for improving heat conductance and mechanical strength by first providing a semiconducting substrate that has a low-k IMD layer on top, then forming a first metal pad for the bond pad and a first metal ring for the heat dissipating ring surrounding and spaced-apart from the first metal pad, then depositing a second IMD material layer and forming photolithographically in the second IMD layer a plurality of metal via plugs connected to the first metal pad and a plurality of dummy via plugs connected to the first metal ring, a third IMD layer is then deposited on top of the structure and a second metal pad which is connected to the plurality of metal via plugs and a second metal ring which is connected to the dummy plugs are then formed photolithographically in the third IMD layer. By utilizing the present invention novel method, the first metal pad, the second metal pad and the plurality of metal via plugs form the bond pad which is surrounded by a spaced-apart heat dissipating ring formed by the first metal ring, the second metal ring and the plurality of dummy via plugs therebetween.

Referring initially to FIG. 1, wherein a present invention semiconductor structure 10 that has a plurality of bond pads 20 formed in a top surface is shown. In each of the bond pad structure 20, a bond pad 22 which is formed by an upper metal pad 24 and a lower metal pad 26 connected therebetween by a plurality of metal via plugs 28. In the same fabrication steps for forming the bond pad 22, the heat dissipating ring 30 may be formed. The heat dissipating ring 30 is constructed by a lower thermally conductive ring 36, an upper thermally conductive ring 34 and a plurality of dummy via plugs 38 connecting therebetween. The fabrication steps for forming the bond pad 22 and the heat dissipating ring 30 is described as follows.

On top of a pre-processed semiconducting substrate, a first layer of IMD material and preferably a low-k IMD material is first deposited (not shown). A first metal pad 26 and a first metal ring 36 surrounding and spaced-apart from the first metal pad 26 are then formed photolithographically by a conventional method. The trenches (not shown) formed are then filled by a typical deposition process such as CVD of a thermally and electrically conductive metallic material such as a refractory metal, aluminum or copper. On top of the first metal pad 26 and the first metal ring 36, is then deposited a second IMD layer of a low-k material. A first plurality of metal via plugs 28 and a second plurality of dummy via plugs 38 are then formed photolithographically and deposited by a deposition technique. On top of the via plugs and the dummy plugs, a third IMD layer of low-k material is then deposited. A second metal pad 24 connected to the first plurality of metal via plugs 28 and a second metal ring 34 connected to the second plurality of dummy via plugs 38 are then formed photolithographically and deposited by a deposition technique. The first metal pad 26, the second metal pad 24 and the first plurality of metal via plugs 28 therefore form the bond pad 22. The surrounding and spaced-apart heat dissipating ring 30 is formed by the first metal ring 36, the second metal ring 34 and the second plurality of dummy via plugs 38 connected therebetween.

It should be noted that any thermally conductive material can be used for forming the first metal ring 36, the second metal ring 34 and the second plurality of dummy via plugs 38. The material needs not be an electrically conductive material since the purpose of the heat dissipating ring is for improving heat conductance and for providing additional anchoring support and thus improving mechanical strength of the bond pad 22. However, to readily execute the present invention novel method, the same material, i.e., an electrically conductive material, used in forming the via plugs, the lower pad and the upper pad can be utilized such that the heat dissipating ring is formed in the same processing steps. The present invention novel heat dissipating ring therefore does not require any additional fabrication steps other than those normally used in forming the bond pads.

Figure 3:
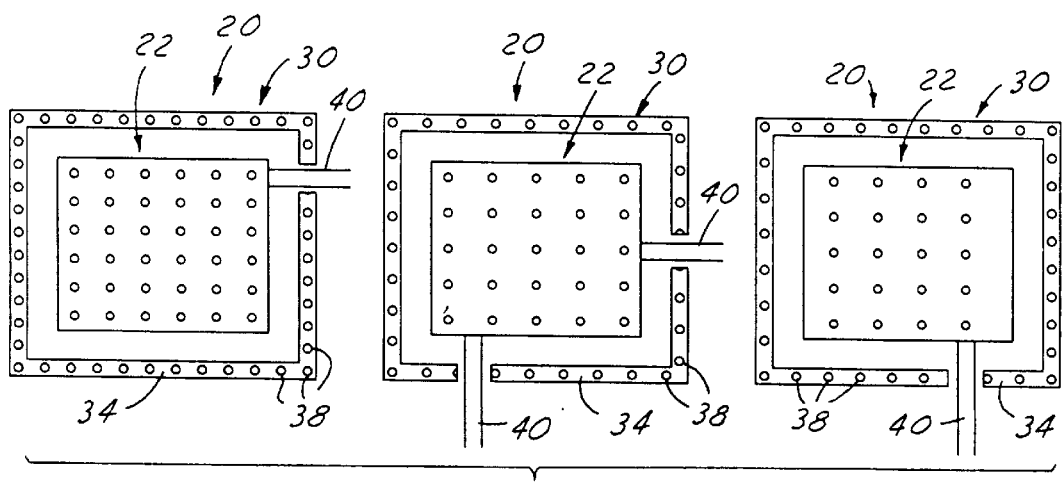
FIG. 3 is an enlarged, plane view of the present invention bond pads equipped with metal runners to the bond pads that are not intercepted by the heat dissipating rings.

When utilizing the present invention novel method in forming the heat dissipating rings around bond pads, the method should be carefully executed such that the heat dissipating ring does not intercept any metal runners to the bond pads. This is shown in FIG. 3. The dummy plugs 38 fabricated according to the present invention novel method should not land on the metal runners 40 if the runners are in existence. Logic operation of the dummy plugs 38 AND the reverse of the underlayer metal 40. The dummy metal lines 34, 36 should be logically ANDed with the reverse tone metal pattern of the current level. It is thus possible that the dummy plugs 38 formed do not short or disturb the circuitry for the bond pad 22. In other words, whenever there is circuitry underneath, the dummy via plugs 38 and the dummy metal lines 34, 36 are not used. This is shown in FIG. 3 wherein the dummy metal lines 34 and the dummy plugs 38 do not intercept the metal runners 40 and thus avoiding a short circuit. A logic AND or NOR may be suitably utilized for forming the present invention heat dissipating ring 30.

The present invention novel heat dissipating ring for the bond pads are formed in the large vacant area usually found around a bond pad in the dielectric material. Since each via plug is a heat source and it is difficult to dissipate the heat away in a low-k IMD material, the present invention novel heat dissipating ring solves the problem of poor heat conductance and poor adhesion between the low-k IMD material and the underlying oxide layer. The material utilized in fabricating the present invention heat dissipating ring, including the upper metal ring, the lower metal ring and the dummy plugs therebetween can be the same material, i.e., a refractory metal such as tungsten or any other suitable metallic material such as aluminum or copper. The thermal budget required for forming the present invention heat dissipating ring is the same as the process for forming the bond pads without the rings. The only modification required for fabricating the heat dissipating ring is a minor change of the photomask such that during the photolithographic process, the dummy plugs are formed simultaneously with the metal via plugs.

Figure 2:
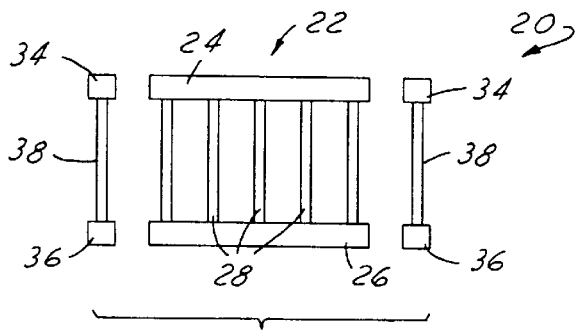
FIG. 2 is an enlarged, cross-sectional view of one of the bond pads equipped with a heat dissipating ring of FIG. 1 illustrating the plurality of via plugs and dummy plugs.

The present invention novel method and apparatus have therefore been amply described in the above descriptions and in the appended drawings of FIGS. 1~3.

While the present invention has been described in an illustrative manner, it should be understood that the terminology used is intended to be in a nature of words of description rather than of limitation.

Furthermore, while the present invention has been described in terms of a preferred and several alternate embodiments, it is to be appreciated that those skilled in the art will readily apply these teachings to other possible variations of the inventions.

The embodiment of the invention in which an exclusive property or privilege is claimed are defined as follows:

I claim:

1. A semiconductor structure comprising:
   a pre-processed semiconducting substrate having a dielectric material layer on top,
   a bond pad substantially surrounded and insulated by said dielectric material layer, said bond pad being formed of two metal layers and a plurality of metal via plugs connected thereinbetween, and
   a heat dissipating ring surrounding and spaced-apart from said bond pad, said heat dissipating ring being formed of an upper conductive ring and a lower conductive ring of substantially the same shape connected thereinbetween by a plurality of dummy via plugs formed of a thermally conductive material.

2. A semiconductor structure according to claim 1, wherein said dielectric material layer being formed of low dielectric constant (low k) material.

3. A semiconductor structure according to claim 2, wherein said low k material is hydrogen silsesquioxane (HSQ) or methyl silsesquioxane (MSQ).

4. A semiconductor structure according to claim 1 further comprising a second heat dissipating ring positioned outside and spaced-apart from said heat dissipating ring.

5. A semiconductor structure according to claim 1, wherein said thermally conductive material for forming said dummy via plug is a metal.

6. A semiconductor structure according to claim 1, wherein said thermally conductive material for forming said dummy via plugs is a refractory metal, aluminum or copper.

7. A semiconductor structure according to claim 1, wherein said plurality of dummy via plugs and said upper and lower conductive rings do not intercept any metal runners for the circuit formed in said semiconductor structure.

8. A bond pad equipped with a heat dissipating ring comprising:
   a bond pad substantially surrounded and insulated by a layer of inter-metal-dielectric (IMD) material, said bond pad being formed of two metal layers and a plurality of metal via plugs connected thereinbetween, and
   a heat dissipating ring surrounding and spaced-apart from said bond pad, said heat dissipating ring being formed of an upper conductive ring and a lower conductive ring of substantially the same configuration connected thereinbetween by a plurality of dummy via plugs formed of a thermally conductive material.

9. A bond pad equipped with a heat dissipating ring according to claim 8, wherein said layer of IMD material is a low dielectric constant material.

10. A bond pad equipped with a heat dissipating ring according to claim 8, wherein said layer of IMD material is hydrogen silesquioxane (HSQ) or methyl silsesquioxane (MSQ).

11. A bond pad equipped with a heat dissipating ring according to claim 8, wherein said heat dissipating ring anchors at least two dielectric material layers together achieving improved mechanical strength.

12. A bond pad equipped with a heat dissipating ring according to claim 8, wherein said plurality of metal via plugs and said plurality of dummy via plugs are formed of the same metal selected from the group consisting of refractory metals, aluminum and copper.

* * * * *